United States Patent
Best et al.

(10) Patent No.: US 8,076,949 B1
(45) Date of Patent: Dec. 13, 2011

(54) ENHANCED PROXIMITY SENSING

(75) Inventors: Andrew Best, Brier, WA (US); Robert Birch, Seattle, WA (US); Louis Bokma, Newark, CA (US); Jonathan R. Peterson, Everett, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 430 days.

(21) Appl. No.: 12/057,801

(22) Filed: Mar. 28, 2008

Related U.S. Application Data

(60) Provisional application No. 60/921,160, filed on Mar. 30, 2007.

(51) Int. Cl.
  *G01R 27/26* (2006.01)
  *G06F 3/041* (2006.01)
(52) U.S. Cl. ........................................ 324/663; 345/173
(58) Field of Classification Search ................... 324/663
  See application file for complete search history.

(56) References Cited

U.S. PATENT DOCUMENTS

| | | | | |
|---|---|---|---|---|
| 5,463,388 A * | 10/1995 | Boie et al. | ........................ | 341/33 |
| 5,825,352 A * | 10/1998 | Bisset et al. | ................... | 345/173 |
| 5,844,415 A * | 12/1998 | Gershenfeld et al. | .......... | 324/663 |
| 6,480,183 B1 * | 11/2002 | Van Ruymbeke et al. | .... | 345/161 |
| 7,331,245 B2 * | 2/2008 | Nishimura et al. | ....... | 73/862.046 |
| 7,436,173 B2 * | 10/2008 | Riedel et al. | .............. | 324/207.18 |
| 2003/0102875 A1 * | 6/2003 | Fujiwara et al. | ............... | 324/663 |
| 2007/0129046 A1 * | 6/2007 | Soh et al. | ........................ | 455/403 |
| 2008/0018611 A1 * | 1/2008 | Serban et al. | .................. | 345/173 |
| 2008/0136792 A1 * | 6/2008 | Peng et al. | ..................... | 345/174 |

* cited by examiner

*Primary Examiner* — Jeff Natalini

(57) ABSTRACT

An embodiment of the present invention is directed to a method for rejecting sensor information when a switch is being pressed in a system having sensors over switches. A switch in the process of being pressed may be determined based on an increase in pressure which may be determined by measuring the increase in capacitance at a plurality of capacitive sensors. The rejection of sensor information when the switch is being pressed allows the user interface to more accurately thus facilitates smooth and jitterless interface operation.

20 Claims, 5 Drawing Sheets

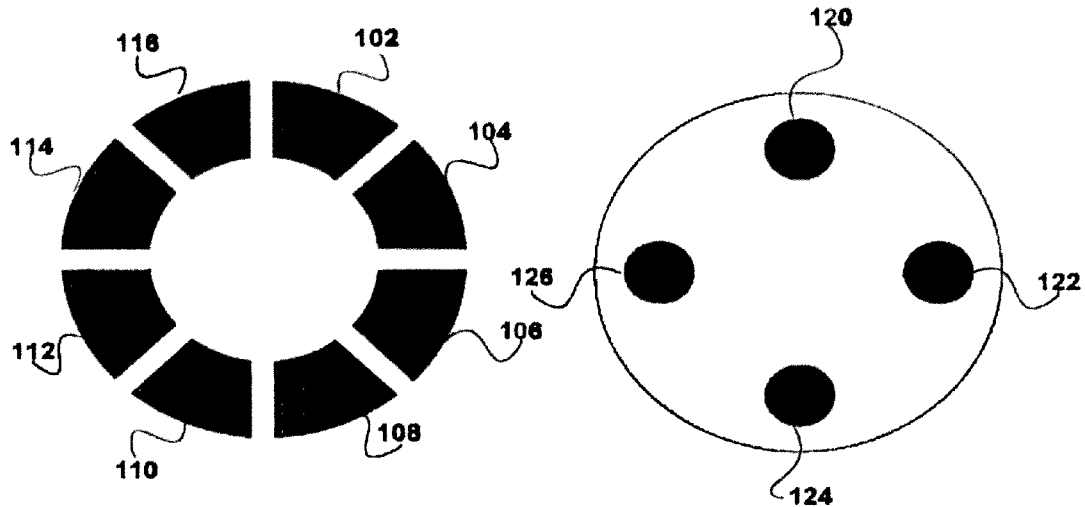
Fig. 1A (Related Art)
Fig. 1B (Related Art)
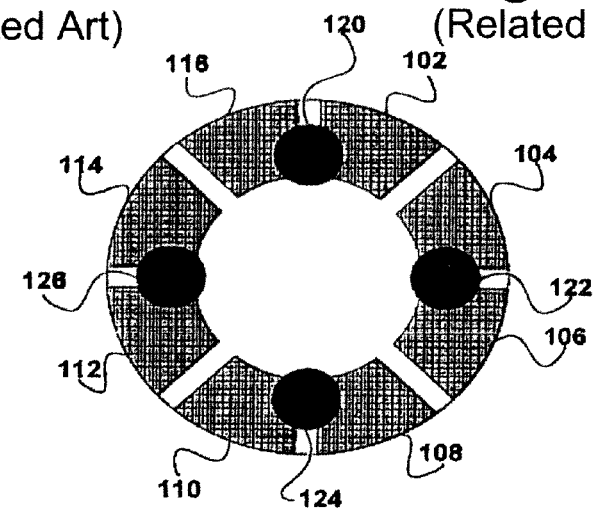
Fig. 1C (Related Art)

300

ENHANCED PROXIMITY SENSING

RELATED U.S. APPLICATIONS

This application claims the benefit of and priority to the copending provisional patent application Ser. No. 60/921,160, entitled "Enhanced Proximity Sensing," with filing date Mar. 30, 2007, and hereby incorporated by reference in its entirety.

FIELD OF INVENTION

Embodiments of the present invention relate to the sensors above switches.

BACKGROUND OF THE INVENTION

Conventional menu navigation devices and interface devices (e.g. a touch pad) use sensors which are placed above switches or buttons to determine centroids and allow a user to indicate position or invoke functions associated with the switches. Capacitive sensors may be used to determine a position of an object, such as a finger. For example, a touch pad may use capacitive sensors to allow a user to move a cursor around and use switches to invoke right and left click functions.

FIGS. 1A-1C show a conventional design for a capacitive sensor and switch based device. Specifically, FIG. 1A shows a conventional arrangement of capacitive sensors 102-116, FIG. 1B shows a conventional arrangement of switches 120-126, and FIG. 1C shows a conventional interface device which has capacitive sensors 102-116 above switches 120-126.

If the user intends to press the switch 120, by the time switch 120 is pressed, debounced, and reported, the adjacent capacitive sensors 102 and 116 will already have measured a change in capacitance and reported the activity. This premature reporting of activity often leads to jittery and unintentional performance of functions associated with the sensors (e.g., position) and thus is undesirable. For example, if switch 120 corresponded to a play button and the capacitive sensors corresponded to volume control, a user trying to push play may unintentionally change the volume.

Conventional designs have attempted to solve this problem by delaying the responsiveness of the sensing until it has been fully determined that a switch has been pressed. For example, a system may wait for a sufficient amount of time for a switch press to be completed before responding to any user input from the capacitive sensors. This non-response period means that a user may be trying enter commands but the system will not register them and thus the user interface will not be smooth and responsive leading to an undesired experience.

SUMMARY OF THE INVENTION

Accordingly, embodiments of the present invention are directed to a method for rejecting sensor information when a mechanical switch is being pressed in a user interface device having sensors over switches. A mechanical switch in the process of being pressed may be determined based on an increase in pressure which may be determined by measuring the increase in capacitance at a plurality of capacitive sensors over a multitude of sample times. The rejection of sensor information when it is determined that the switch is being pressed allows the user interface to more accurately and smoothly report a user's commands.

More specifically, an embodiment of the present invention is directed to a method for detecting a switch being pressed, the method includes measuring an increase in a capacitance of a plurality of adjacent capacitive sensors, measuring a change in the quantity of a plurality of sensors changing in capacitance, determining whether a button is being pressed and rejecting data from said plurality of adjacent capacitive sensors to reduce the detection of false input.

Another embodiment of the present invention is directed to a method for determining whether a button is being pressed and includes measuring changes in the proximity of an object with a plurality of sensors, determining whether the pressure of an object is increasing, wherein the pressure of an object is determined based on the magnitude of change in proximity of said plurality of sensors. To reduce the detection of false inputs, the method also includes not transmitting information related to the proximity of said object.

Another embodiment of the present invention is a system including a plurality of sensors, a plurality of switches, wherein the switches are adjacent to the plurality of sensors, and a control unit for communicating with an apparatus and coupled to the plurality of sensors and the plurality of switches, wherein the control unit determines a change in pressure based on signals from the plurality of sensors and based on the change in pressure ignores information from the plurality of sensors. The control unit determines the change in pressure to accurately determine whether a user is pressing one of the plurality of switches or using the capacitive sensors to interact with a device.

BRIEF DESCRIPTION OF THE DRAWINGS

FIGS. 1A, 1B and 1C show block diagrams of a conventional art sensor and switch based device.

DESCRIPTION OF THE INVENTION

Reference will now be made in detail to the preferred embodiments of the claimed subject matter, examples of which are illustrated in the accompanying drawings. While the invention will be described in conjunction with the preferred embodiments, it will be understood that they are not intended to limit the claimed subject matter to these embodiments. On the contrary, the claimed subject matter is intended to cover alternatives, modifications and equivalents, which may be included within the spirit and scope of the claimed subject matter as defined by the claims. Furthermore, in the detailed description of the present invention, numerous specific details are set forth in order to provide a thorough understanding of the claimed subject matter. However, it will be obvious to one of ordinary skill in the art that the claimed subject matter may be practiced without these specific details. In other instances, well known methods, procedures, components, and circuits have not been described in detail as not to unnecessarily obscure aspects of the claimed subject matter.

Example Operations

Figure 2:
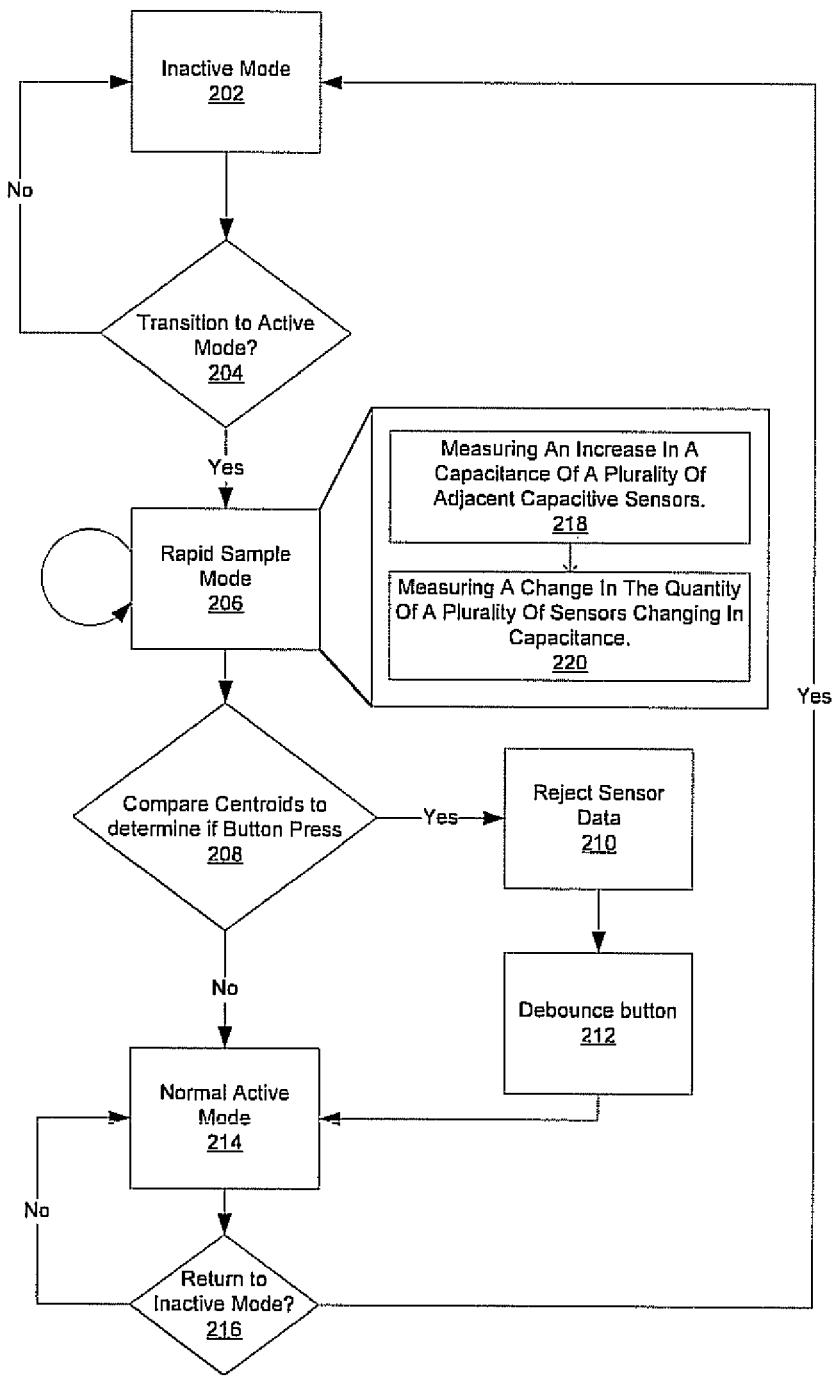
FIG. 2 is a flowchart of a process for detecting the press of a switch, in accordance with one embodiment of the present invention.
Figure 3:
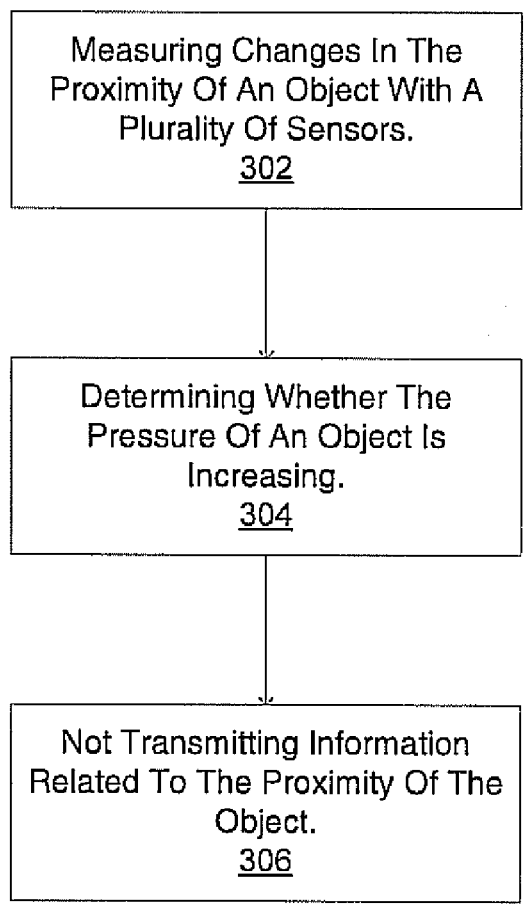
FIG. 3 is a flowchart of a process for determining if a button is being pressed, in accordance with another embodiment of the present invention.

With reference to FIGS. 2-3, flowcharts 200 and 300 each illustrate example functions used by various embodiments of the present invention. Flowcharts 200 and 300 include processes that, in various embodiments, are carried out by a processor under the control of computer-readable and computer-executable instructions. Although specific function blocks ("blocks") are disclosed in flowcharts 200 and 300, such steps are examples. That is, embodiments are well suited to performing various other blocks or variations of the blocks recited in flowcharts 200 and 300. It is appreciated that the blocks in flowcharts 200 and 300 may be performed in an order different than presented, and that not all of the blocks in flowcharts 200 and 300 may be performed.

FIG. 2 is a flowchart 200 of an exemplary process for detecting the pressing of a switch or button in accordance with an embodiment. The blocks of flowchart 200 may be carried out on a plurality of devices such as those used for navigation and interfacing with a plurality of devices. For example, blocks of flowchart 200 may be performed in the operation of devices, including but not limited to: touch pads, radial sliders, volume controls, digital cameras, sliders, brightness controls, touch screens, portable media players, phones, and handheld devices. In one embodiment, the blocks of flowchart 200 are performed on a system that includes a plurality of adjacent capacitive sensors adjacent to a plurality of switches.

At block 202, a device is in or enters an inactive mode. The device may sample and report inputs at a specified interval slower than when the device is in an active mode. For example, the active mode of a device may have a 16 ms loop time which is the time between reporting packets of input information and the inactive mode may have a 100 ms loop time.

At block 204, the device determines whether to transition to active mode or stay in an inactive mode. The determination may be based on whether input is received by the device (e.g., detection of a finger approaching an input).

At block 206, the device enters a rapid sample mode. The rapid sample mode may have a scan rate that is 3 to 4 times faster than the active mode. The rapid sample mode allows for multiple scans of capacitive sensors to be made before reporting input on the normal active mode interval (e.g., 16 ms). For example, the rapid sample mode may sample sensor data at 4-5 ms intervals and take multiple samples before reporting a packet on a 16 ms interval of normal active mode. During the rapid scans, the raw counts and number of sensors above the noise threshold are recorded.

At block 218, an increase in capacitance of a plurality of adjacent sensors is measured. At block 220, a change in the quantity of a plurality of sensors changing in capacitance is measured. That is, as an object approaches a button an increase in capacitance of a plurality of adjacent sensors and a change in the quantity of sensors changing in capacitance can be measured. For example, as a finger approaches a single point in proximity to the plurality of sensors, a portion of the sensors near that single point will have an increase in capacitance. For example, if there are three capacitive sensors near a switch, as an object approaches the switch, the three sensors closest to the switch will have a comparatively higher change in capacitance. The device may remain in a rapid sample mode or perform a set of rapid scans a variable number of times to handle user input. During the rapid scan mode, centroids are determined and stored based on the sensor reported data.

At block 208, the centroids are compared to determine if a button is being pressed. In one embodiment, the raw counts (e.g., number of sensors) and the number of active sensors are compared and evaluated to see if the values are trending up. If the centroid is increasing in width, or the raw counts are increasing it is possible to determine that the user is attempting to press a physical switch or button located behind the sensor. For example, if there is no increase in centroid width or raw count, that device may enter normal active mode 214 or remain in rapid sample mode 206. On the other hand, if the centroid comparison indicates that a button is being pressed or about to be pressed, then block 210 is entered.

At block 210, data from the plurality of sensors is rejected in order to reduce the detection of false user input. The sensor data is not reported to a user input detection unit. For example, if there is an application of a localized pressure (e.g., change in capacitance at a specific portion of the sensors), the information related to the capacitive sensors will be rejected, ignored, or not transmitted and thus the button press information will be transmitted to the device or application without any inaccurate or premature sensor information. According to various embodiments, the data may be ignored until the button press has been completed (e.g., debounced) or a change in capacitance across a plurality of sensors that is broader in area. In contrast, when there are not localized changes in pressure as determined above, information may be communicated associated with the change in capacitance of the sensors and the associated function of the capacitive sensors will be executed.

At block 212, the button press signal is debounced. The rejection of the centroid allows the button press signal to be debounced and reported accurately to the device. For example, the press of a play button may be accurately reported instead of a volume increase associated with the sensors.

At block 214, the device enters a normal active mode. The normal active mode may have a sample rate more frequent (e.g., 16 ms) than the inactive mode (e.g., 100 ms). The active mode may further facilitate and handle regular device operations (e.g., power button, button without associated sensors, etc.)

At block 216, the device determines whether to return to inactive mode. The determination may be based on user input such a sleep mode selection or a period of inactivity by a user.

FIG. 3 is a flowchart 300 of an exemplary process for determining if a button is being pressed in accordance with an embodiment of the present invention. The function blocks of flowchart 300 may be carried out on a device used for a variety of functions including, but not limited to, menu navigation and interfacing with a plurality of devices. For example, blocks of flowchart 300 may be performed in the operation of various devices including, but not limited to: touch pads, radial sliders, volume controls, digital cameras, sliders, brightness controls, touch screens, portable media players, phones, and handheld devices. The blocks of flowchart 300 facilitate smooth and jitterless use of navigation and interface devices because when a user is pressing a button, information from the capacitive sensors will not be transmitted, since such information would prematurely invoke the functions associated with the capacitive sensors and could lead to the detection of false user input.

At block 302, changes in the proximity of an object are measured with a plurality of sensors. A change in capacitance at a plurality of capacitive sensors may be measured to determine a change in the proximity of an object. More specifically, capacitive sensors that are located adjacent to a button may be measured for changes in capacitance. Such measurements can indicate that an object, e.g. a finger tip, is approaching a button.

At block 304, whether the pressure of an object is increasing is determined. Based on whether the capacitance of a plurality of adjacent sensors is increasing, a determination can be made as to whether an object is increasing in proximity to a localized area or a broader area. The capacitance measurements may take into account a plurality of characteristics of the housing of the sensors and the sensors themselves including, but not limited to, the size of the sensors, the properties of the material covering the sensors, and material thickness. The proximity of the sensors to a button may also be considered. In one embodiment, the buttons may be dome switches. For example, an increase in the proximity of an object measured by a change in capacitance of sensors near a button may indicate that a user is intending to press a button and not perform the function associated with the capacitive sensors (e.g. change position).

At block 306, information related to the proximity of the object is not transmitted in this mode to reduce false detection of user input. Where there is a localized change in capacitance of the sensors near a button, information related to the button will be transmitted as soon as the button is completely pressed and information associated with the capacitive sensors (e.g. position information) will not be transmitted, rejected, or ignored. If the capacitance changes are not localized, information associated with the capacitive sensors will be transmitted. The information may not be transmitted until the button press has been completed or changes in capacitance of a plurality of sensors are measured.

Example System

Figure 4:
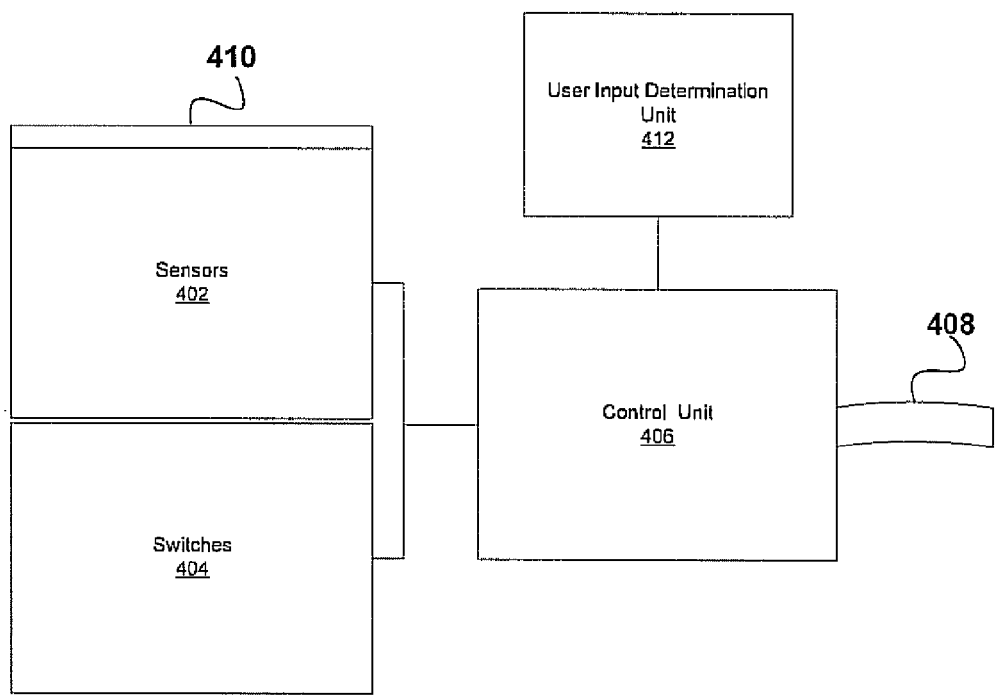
FIG. 4 shows a side view of an exemplary capacitive sensor and switch based system, in accordance with an embodiment of the present invention.

FIG. 4 illustrates example components used by various embodiments of the present invention. Although specific components are disclosed in system 400 it should be appreciated that such components are examples. That is, embodiments of the present invention are well suited to having various other components or variations of the components recited in system 400. It is appreciated that the components in system 400 may operate with other components than those presented, and that not all of the components of system 400 may be required to achieve the goals of system 400. It is appreciated that embodiments of system 400 include a variety of devices, including but not limited to touch pads, radial sliders, volume controls, digital cameras, sliders, brightness controls, touch screens, portable media players, phones, and handheld devices. System 400 includes sensors 402, switches 404, control unit 406, communications link 408, overlay material 410, and user input determination unit 412.

It is appreciated that switches 404 may be below or under sensors 402 which are covered by material 410. In one embodiment, switches 404 may be dome switches and sensors 402 may be capacitive sensors. Material 410 is a material appropriate for the device system 400 is integrated within. For example, if system 400 is part of a touch pad, material 410 may be opaque and have a surface texture to facilitate accuracy of the touch pad.

Control unit 406 is communicatively coupled to sensors 402 and switches 404. Communication link 408 communicatively couples control unit 406 with the device system 400 is part of or integrated into. Communications link 408 allows control unit 406 to communicate information gathered from sensors 402 and switches 404. Based on information received from sensors 402, control unit 406 determines the pressure that is being applied to determine whether the user is pressing one of switches 404 or invoking the function associated with sensors 402. Based on the changes in capacitances and the quantity of sensors changing in capacitance, a determination can be made as to whether the object is applying pressure at a localized point. In one embodiment, control unit 406 may take into account a plurality of characteristics of overlay material 410 (covering sensors 402) and sensors 402 themselves including but not limited to the size of the sensors, the thickness of the material covering the sensors and the properties of the material itself.

In one embodiment, control unit 406 determines if there is a change in pressure being applied by measuring the change in capacitance in a portion of the plurality of sensors. If the largest change in capacitance is in a portion of the plurality of sensors that are adjacent to a switch, control unit 406 ignores, rejects, or does not transmit information over communication link 408 associated with the change in capacitance in order to reduce the detection of false user input. For example, as an object approaches a switch, the capacitive sensors nearest to the switch will have the largest change in capacitance which is suggestive that a button is being pressed and not the function associated with the plurality of capacitive sensors, thus control unit 406 will ignore the information associated with the change in capacitance. In one embodiment, Control unit 406 may ignore the change in capacitance of the sensors until the button press completes or there is a change in capacitance across a broad area.

Control unit 406 reports input received to user input determination unit 412. User input determination unit 412 may be a portion of a device (e.g., an interface or input controller) which receives inputs signals and sends the input to an appropriate part of a device. For example, user input determination unit 412 may provide user input to a processor (e.g., of a handheld device, portable music player, phone and the like) via communications bus. User input determination unit 412 may further process the input (e.g., convert to ASCII).

Thus, embodiments of the present invention reduce the premature reporting of information associated with the function of the capacitive sensors to reduce the detection of false user input. Thus, a substantial improvement in smoothness and jitterless use of control and interface devices is achieved.

Figure 5:
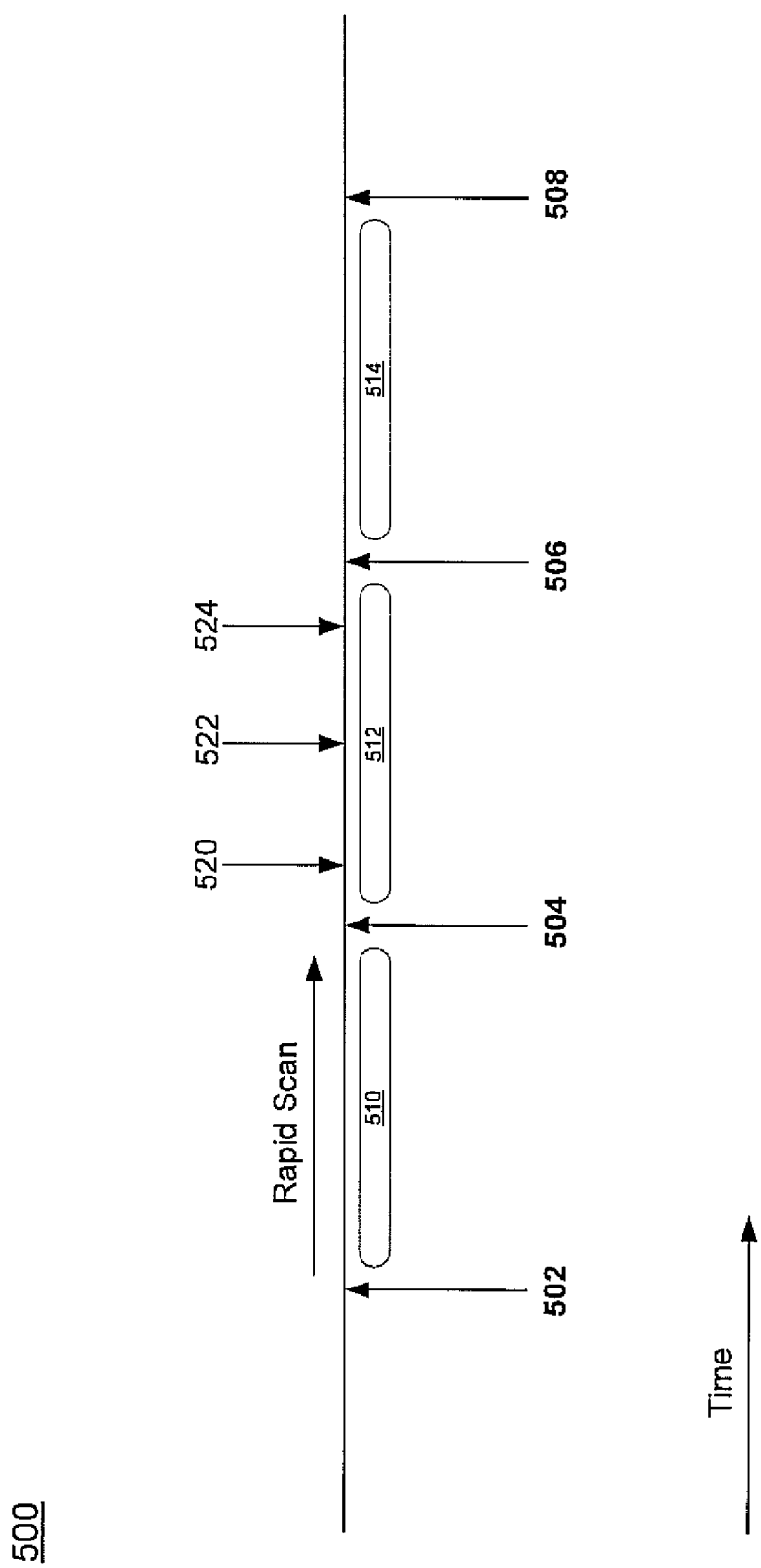
FIG. 5 shows an exemplary timing diagram related to the reporting of input data, in accordance with an embodiment of the present invention.

FIG. 5 shows an exemplary timing diagram related to the reporting of input data, in accordance with an embodiment of the present invention. Points in time 502-508 are points where user input is reported. During a normal active mode, sampling is performed at a normal scan rate (e.g., 16 ms) and may correspond to reporting of input (e.g., points in time 502-508). Periods of time 510-514 are periods of time between points in time 502-508. It is appreciated that in a normal active mode input sampling may be done at any point during the period between reporting of input information or may be sampled just prior to reporting input (e.g., points in time 502-508).

During periods of time 510-514, a system in accordance with one embodiment of the present invention (e.g., system 400) may operate in a rapid scan mode where inputs are sampled at an increased rate (e.g., 3-4 ms). It is appreciated that a system in accordance with one embodiment of the present invention may remain in a rapid scan mode during multiple reportings of input data (e.g., points in time 502-508). Points 520-524 mark sampling of inputs during period 512. For example, if during period 512, a system in accordance with an embodiment of the present invention detects an increase or trending up in the raw counts and the number of active sensors and thus the centroid is increasing, the system can determine that a user is attempting to press a physical switch or button located behind the sensor. If it is determined that a user is pressing a button, on the next reporting of input information (e.g., point 506), the system will reject or ignore the sensor data and report the button press. The button press may then be accurately debounced and user input accurately reported. If it is determined that a user is not pressing a button, on the next reporting of input information (e.g., point 506), the input information associated with the sensor data will be reported.

Embodiments of the present invention are thus described. While the present invention has been described in particular embodiments, it should be appreciated that the present invention should not be construed as limited by such embodiments, but rather construed according to the below claims.

What is claimed is:

1. A method for detecting a pressing of a button comprising:
    measuring an increase in capacitance of a plurality of adjacent capacitive sensors of a user input device, said user input device comprising said button and said plurality of adjacent capacitive sensors disposed adjacent to said button;
    determining a number of said plurality of adjacent capacitive sensors having the increased capacitance;
    using said measured increase in capacitance and said determined number of said plurality of adjacent capacitive sensors having the increased capacitance to determine whether said button is being pressed; and
    provided said button has been determined to be being pressed, rejecting data from said plurality of adjacent capacitive sensors, said data corresponding to the increased capacitance.

2. The method of claim 1 further comprising:
    reporting sensor data during a normal mode at a first scan rate; and
    increasing said scan rate to a second rate when performing said measuring and said determining, wherein said second rate has a higher frequency than said first scan rate.

3. The method of claim 1, wherein capacitance of said measuring is based on a characteristic of material overlaying said plurality of adjacent capacitive sensors.

4. The method of claim 1, further comprising: debouncing said button press.

5. The method of claim 1, wherein capacitance of said measuring is based on a size of said plurality of adjacent capacitive sensors.

6. A method for determining if a button is being pressed comprising:
    measuring changes in a proximity of an object with a plurality of sensors of an input device comprising said plurality of sensors and said button;
    determining whether a pressure of said object is increasing, wherein said pressure of said object is determined based on a change in capacitance of said plurality of sensors based on said proximity of said object; and
    provided it is determined that pressure of said object is increasing, not reporting information related to said change in capacitance of said plurality of sensors to a user input detection unit.

7. The method of claim 6, wherein said plurality of sensors are adjacent.

8. The method of claim 6, wherein said plurality of sensors are adjacent to a plurality of buttons.

9. The method of claim 6, wherein said plurality of sensors comprises a plurality of capacitive sensors.

10. A system comprising:
    a plurality of sensors;
    a plurality of switches, wherein said plurality of switches are adjacent to said plurality of sensors; and
    a control unit for communicating with an apparatus and coupled to said plurality of sensors and said plurality of switches and wherein said control unit determines a change in pressure of said plurality of sensors based on electronic signals from said plurality of sensors, and based on said pressure, said control unit operable to ignore information from said plurality of sensors during user input determination, said information corresponding to an increase in capacitance measured by said plurality of sensors.

11. The system as described in claim 10, wherein said plurality of switches are dome switches.

12. The system as described in claim 10, wherein said plurality of sensors are capacitive sensors.

13. The system as described in claim 10, wherein said plurality of switches and sensors comprises a touch pad.

14. The system as described in claim 10, wherein said plurality of switches and sensors comprises a radial slider.

15. The system as described in claim 10, wherein said plurality of switches and sensors comprises a volume control.

16. A method of detecting user input on a user input device comprising said method comprising:
    measuring an increase in capacitance of a plurality of adjacent capacitive sensors of said user input device comprising said plurality of adjacent capacitive sensors and a button, wherein said plurality of adjacent capacitive sensors are disposed adjacent to said button;
    determining a number of said plurality of adjacent capacitive sensors having the increased capacitance;
    using said measured increase in capacitance and said determined number of said plurality of adjacent capacitive sensors having the increased capacitance to determine whether said button is in a process of being pressed; and
    provided said button has been determined to be in a process of being pressed, rejecting data from said plurality of adjacent capacitive sensors in a user input determination process, said data corresponding to the increased capacitance.

17. The method as described in claim 16, wherein said plurality of sensors and button comprises a slider.

18. The method as described in claim 16, wherein said plurality of sensors and button comprises a brightness control.

19. The method as described in claim 16, wherein said plurality of sensors and button comprises a touch screen.

20. The method as described in claim 16, wherein said plurality of sensors and button comprises a portable media player.

* * * * *